United States Patent

Costello

Patent Number: 5,733,376
Date of Patent: *Mar. 31, 1998

[54] APPARATUS FOR SPRAY COATING OPPOSING MAJOR SURFACES OF A WORKPIECE

[75] Inventor: Bernard J. Costello, Princeton, N.J.

[73] Assignee: Argus International, Ringoes, N.J.

[*] Notice: The term of this patent shall not extend beyond the expiration date of Pat. No. 5,588,996.

[21] Appl. No.: 283,987

[22] Filed: Aug. 1, 1994

Related U.S. Application Data

[63] Continuation-in-part of Ser. No. 222,125, Apr. 1, 1994.

[51] Int. Cl.$^6$ ............................................. B05C 11/00
[52] U.S. Cl. ............... 118/668; 118/323; 118/324; 118/315; 118/316; 118/220; 239/130; 239/134; 239/142; 239/175
[58] Field of Search ................... 118/668, 324, 118/313, 315, 316, 226, 323; 239/130, 134, 142, 175

[56] References Cited

U.S. PATENT DOCUMENTS

| | | | |
|---|---|---|---|
| 3,526,207 | 9/1970 | Nadelson | 118/50 |
| 4,425,868 | 1/1984 | Shapiro | 118/34 |
| 4,558,657 | 12/1985 | Rohrbach | 118/70 |
| 4,607,590 | 8/1986 | Pender | 118/314 |
| 4,611,554 | 9/1986 | Mahlkow et al. | 118/316 |
| 4,614,660 | 9/1986 | Weibye | 426/461 |
| 4,695,482 | 9/1987 | Weiswurm | 427/96 |
| 4,836,137 | 6/1989 | Heine et al. | 118/663 |
| 4,947,787 | 8/1990 | Grah et al. | 118/64 |
| 4,949,665 | 8/1990 | Weber | 118/66 |
| 5,205,869 | 4/1993 | Ahern | 118/324 |
| 5,221,341 | 6/1993 | Heine | 118/630 |
| 5,232,501 | 8/1993 | Pender et al. | 118/300 |
| 5,256,200 | 10/1993 | Poulson et al. | 118/323 |
| 5,270,248 | 12/1993 | Rosenblum et al. | 437/160 |
| 5,288,323 | 2/1994 | Pender | 118/314 |
| 5,368,219 | 11/1994 | Hogan et al. | 228/33 |
| 5,393,348 | 2/1995 | Morris | 118/668 |

*Primary Examiner*—Nina Bhat
*Attorney, Agent, or Firm*—Louis Weinstein

[57] ABSTRACT

Apparatus for sequentially coating opposite major surfaces of a workpiece such as a printed circuit board and wherein the amount of manual handling is significantly reduced. Boards are arranged end-to-end preferably in closely spaced fashion upon a conveyor having an adjustable drive. First and second spray assemblies provide a low pressure spray having a substantially oval-shaped spray pattern and are arranged upon guide tracks to move in a reciprocating fashion in a direction transverse to the direction of movement of the conveyor for coating opposing surfaces of the workpiece. The speed of movement of the spray heads and the extreme ends of the range of movement are adjustable by controlling the operation of a drive motor to create a substantially Z-shaped spray pattern on the workpiece with the size of the Z-shaped pattern being a function of the conveyor speed spray head assembly, drive speed and range of movement of each spray head assembly. Control may be exerted by a microprocessor based computer system receiving input information regarding size of workpiece, thickness of coating and the like for automatically controlling the conveyor motor and the spray assembly motor thus further simplifying the speed and ease of setup changes as well as significantly reducing waste of coating material and the like. An exhaust system is provided for each spray assembly to remove and dispose of unused spray, fumes and the like. Shields are provided to shield marginal edges of workpieces and the edge conveyors from overspray and to divert accumulated overspray to a collector.

46 Claims, 2 Drawing Sheets

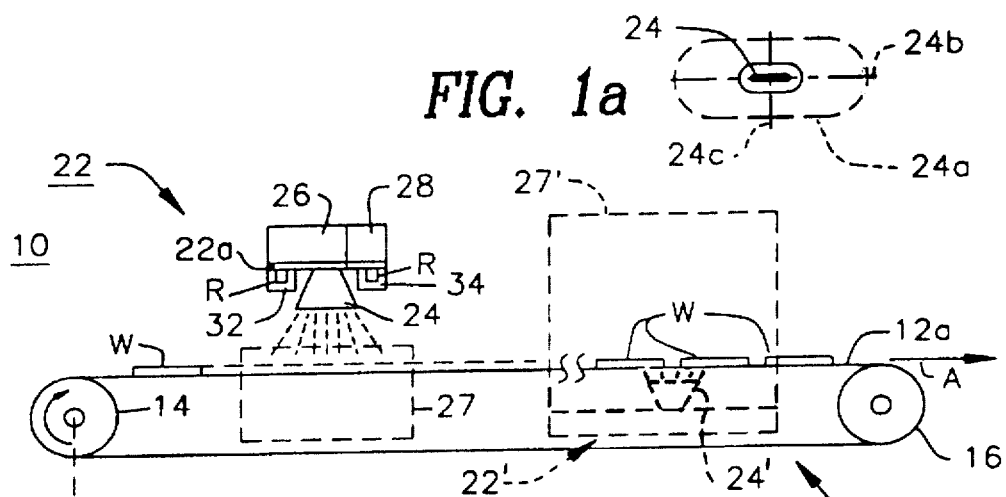
FIG. 1a
FIG. 1
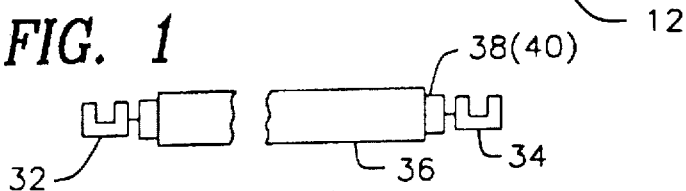
FIG. 1d
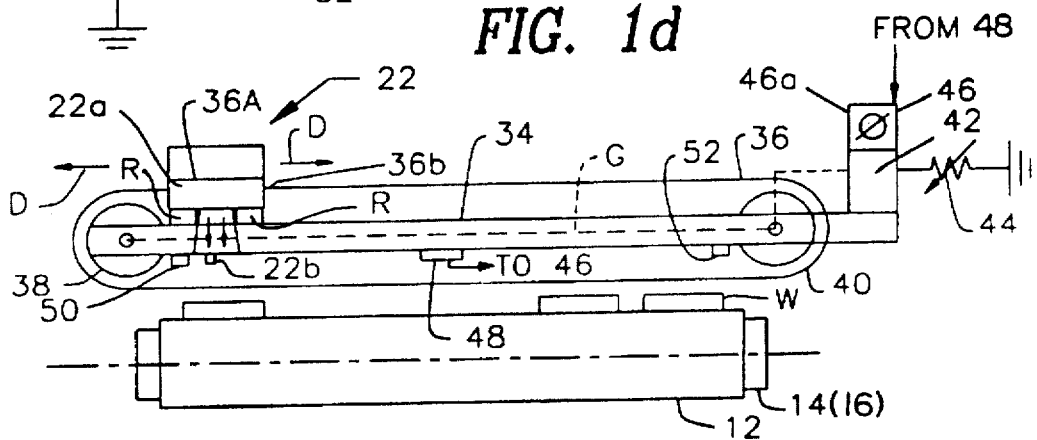
FIG. 1b
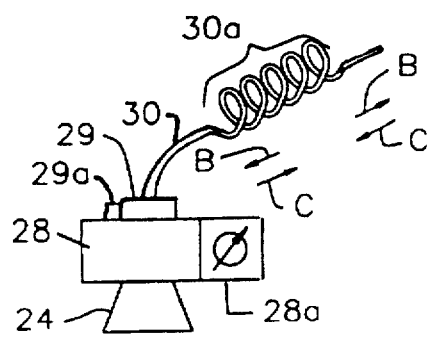
FIG. 1c
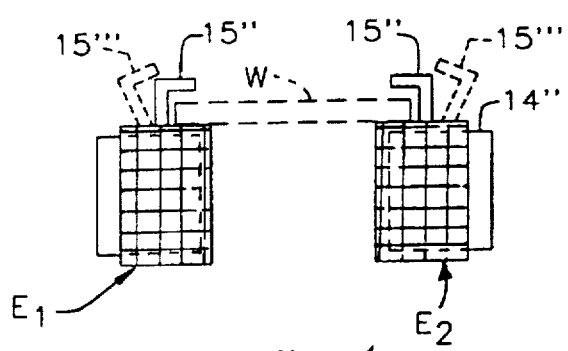
FIG. 1e

APPARATUS FOR SPRAY COATING OPPOSING MAJOR SURFACES OF A WORKPIECE

This application is a continuation-in-part of application Ser. No. 222,125, filed Apr. 1, 1994 now U.S. Patent Pending.

FIELD OF THE INVENTION

The present invention relates to spray coating of flat surfaces with a paint-like material and more particularly to coating in a continuous, sequential manner, both opposing major surfaces of a printed circuit board with a liquid photoresist which is subsequently dried and imaged to produce a primary image or solder mask. The method and apparatus is also applicable for coating circuit assemblies with conformal coating material to protect circuits from mechanical damage and/or corrosion.

BACKGROUND OF THE INVENTION

A number of methods have been used in the past and are still presently in use for coating printed circuits. One of the most widely used methods is screen printing wherein a surface area of a board to be coated is defined by an opening in the screen device. Coating material is applied to the screen and is urged through the opening by the wiping action of a squeegee drawn across the screen. The amount of material deposited on the surface is determined by screen dimensions, material rheology and the speed of the squeegee traversing the screen. Whereas the screen method has the advantages of being accurate, fast and repeatable, disadvantages reside in the need to provide a specific screen for a specific board size, the complicated setup needed to establish machine parameters and the limited life of a screen.

A second method in popular use is curtain coating. In practice, a web of liquid is caused to fall from a metering device in a known and controlled geometry. The web is situated transverse to a conveyor or similar handling mechanism. The workpiece passes beneath the web and intersects the falling liquid and collects a controlled amount of falling liquid along an upper surface of the workpiece. Whereas curtain coating has the advantages of high productivity and minimal setup when changing from one board size to another, disadvantages reside in the fact that the equipment is not easily turned off and on again for short-run work, the equipment is relatively expensive in terms of capital required and the technique requires a large charge of material for proper operation. When thin coatings are desired, there is a tendency to skip and thereby not completely and properly cover the surface to be protected.

A third method of application is electrostatic spray which requires an electrically conductive material. A voltage is applied between the spray device and the surface being coated. An electric field created by the applied voltage causes the coating material particles to be accelerated and attracted to the surface being coated. Whereas advantages reside in the ability to completely coat the surface with negligible setup, the disadvantages are: high initial costs; tendency to waste material due to overspray; potential for electrical discharge and operator hazard to high voltage in the work area.

BRIEF DESCRIPTION OF THE INVENTION

The present invention is characterized by the employment of low pressure air spraying techniques for the application of liquid to the major surfaces of a printed circuit board whether for primary imaging or solder mask. The techniques provided are designed with an objective to require only minimal setup and/or equipment changes to accommodate changes in production. The system apparatus comprises a conveyor for carrying the workpiece, spray guns for applying coating material to opposing major surfaces of printed circuit boards, and an exhaust system to control air flow and overspray in the work areas, the conveyors providing edge supporting and/or connecting means for supporting and holding boards along marginal edge portions thereof which do not require coating(s).

Workpieces are preferably moved horizontally along a conveyor means which is preferably a pair of edge supporting structures to provide support for the side edges of the part. Work is preferably placed so that opposing parallel sides of the work are supported by the conveyor means with the leading and trailing edges of parts preferably in close proximity to minimize spray losses between the parts or workpieces.

To perform the first spray operation, the spray gun is positioned above the moving plane of the workpiece and is pointed downwardly toward the top surface of the workpiece. The second spray operation is performed by a spray gun pointed upwardly toward the bottom surface of the workpiece. If desired the sequence of the first and second spray guns may be reversed.

The spray pattern of the spray gun is preferably oval in shape with a ratio of the oval dimensions being about five-to-one such that the width of the pattern is about ⅕ that of the length or longitudinal dimension, which is aligned to be substantially parallel to the direction of workpiece travel.

Each spray gun is mounted on a cart movable transverse to the direction of workpiece travel. The cart is driven by a variable speed motor. During operation the spray gun is caused to travel across the path of the workpiece while spraying the coating material onto the workpiece surface. At the extremes of travel of the spray gun, the drive motor is reversed causing the travel of the spray gun to reverse. Velocity and distance of travel of the spray gun and the speed of the workpiece results in a "Z-shaped" path described by the spray gun relative to the workpiece. The width and pitch of the Z-shaped path are determined by the relative speeds of the spray gun and the workpiece. The oval pattern of the spray and the pitch of the Z-shaped path are adjusted to eliminate apparent non-uniformity by causing successive passes of the spray pattern to overlap and eliminate non-uniform spray coating.

The traverse mechanism determines the width of the spray pattern by reversing direction at the extremes of travel, which is adjustable.

The design of the system is such as to enable setup changes to be made quickly and easily to accommodate changes in workpieces being processed. One preferred technique for accomplishing this result is to provide a proximity switch which detects the position of the moving cart and initiates a timer to control movement of the spray gun from a center position to the outer extreme positions. The timer is adjustable to adjust the distance of the extreme position from the center point. Speed of movement is adjusted by adjusting the drive motor. The timing functions may vary to accommodate asymmetric shapes of work. Given the velocity of the spray gun, the excursion, the speed of the conveyor and fluid properties are all known, this data may be manipulated by an embedded computer which computes speeds as a function of fluid thickness, for example, thus minimizing operator control and further expediting setup changes.

An exhaust system is provided to accumulate unused spray, fumes and the like. The other major (lower) surface of the workpiece is spray coated by a spray gun and transverse driving system substantially the same as those used to spray coat the upper surface. A similar exhaust system is employed for accumulating unused spray, fumes and the like present when coating the underside of the workpiece. The conveyor system enables coating of opposite major surfaces of the workpiece while reducing the amount of handling, and significantly reduces the time required for the successive coating operations. Also the time required to allow the workpiece to dry after the first spray coating is totally eliminated.

The sequence described may be performed in reverse order; i.e. spraying the lower side first and then the upper side last.

The above technique also eliminates the need for careful handling in systems requiring the workpieces to be turned over or turned around which can result in defacing of the coating, rendering the coating useless.

To minimize accumulation of spray material on the edge conveyors, they are designed to grip or make contact with a minimal edge portion of a workpiece. Offsetting (i.e. printback) of spray material from the conveyor to subsequent workpieces and contamination of the edge conveyors is avoided through the use of a stationary shield positioned above and below the edge conveyors. In addition the marginal edge portion can be designed to be removed or cut away. The shield further collects and diverts the overspray to a collection area which is located to prevent the collected liquid from dripping upon workpieces. The shield is easily removable and replaceable to facilitate cleaning thereof. Shields and collection means are provided for the coating apparatus for the upper and lower major surfaces.

OBJECTS OF THE INVENTION

It is therefore an object of the present invention to provide method and apparatus for effectively coating both major surfaces of printed circuit boards and the like and especially providing method and apparatus for effectively applying thin coatings of liquid.

Another object of the present invention is to provide a novel spraying method for uniformly spray coating both major surfaces of printed wiring boards and the like and which is designed to facilitate fast and easy setup changes.

Another object of the present invention is to provide a novel spraying method for uniformly spray coating both major surfaces of printed wiring boards and the like and which is designed to reduce costs for coating apparatus.

Another object of the present invention is to provide a novel spraying method for uniformly spray coating both major surfaces of printed wiring boards and the like and which is designed to minimize wasting of spray material.

Still another object of the present invention is to provide a novel method and apparatus for coating opposing major surfaces of printed circuit boards and the like including means for automatically traversing workpieces carried upon a conveyor with a predetermined coating spray pattern so as to traverse a substantially Z-shaped spray pattern relative to the workpiece wherein the shape of the pattern is a function of conveyor speed and a traversal speed of the spray gun and wherein the length and width of the pattern are quickly and easily adjustable thus significantly simplifying setup changes.

Another object of the present invention is to provide exhaust systems for use with spray coaters for coating opposing major surface of a printed wiring board.

Still another object of the present invention is to provide conveying means for use in a coating system for coating opposing major surfaces of a workpiece wherein the edge conveyors provide support of the workpiece along at least one side edge so as not to interfere with the areas requiring a coating.

Still another object is to provide a novel spraying method for uniformly spray coating both major surfaces of printed wiring boards and the like and which is designed to minimize wasting of spray material by shield means for diverting spray material from the marginal edges of the workpieces as well as the edge conveyors supporting the workpieces.

BRIEF DESCRIPTION OF THE FIGURES

The above, as well as other objects of the present invention, will become apparent when reading the accompanying description and drawings in which:

FIG. 1 is a longitudinal side elevational view of spray apparatus embodying the principles of the present invention.

FIG. 1a shows a typical spray pattern for each of the spray heads of FIG. 1.

FIG. 1b shows an end elevational view of the apparatus of FIG. 1 showing a spray assembly drive control for one of the spray coaters in greater detail.

FIG. 1c shows an alternative liquid spray supply means usable with each of the spray coaters in the apparatus of FIG. 1.

FIG. 1d shows the manner in which rollers for the spray assembly drive control belt are arranged between guide tracks of the spray assembly of FIGS. 1 and 1b.

FIG. 1e shows a conveyor belt arrangement for use in the conveyor employed in the system of FIG. 1.

DETAILED DESCRIPTION OF THE INVENTION AND PREFERRED EMBODIMENTS THEREOF

Figure 1F:
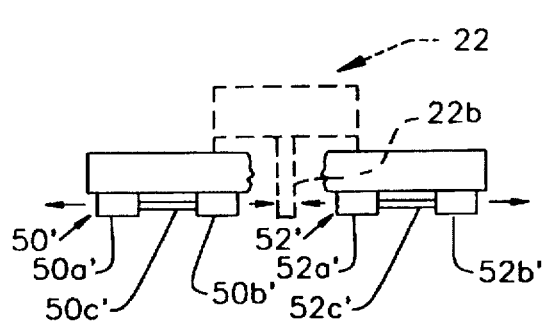
FIG. 1f shows an alternative sensor arrangement which may be employed in the drive control system for the spray assembly of FIG. 1b.

FIG. 1 shows a system 10 embodying the principles of the present invention and comprising a conveyor means 12 entrained about upstream and downstream rollers 14 and 16, respectively. The upper run 12a supports workpieces W along opposite sides thereof and which may be of any shape and size that can be accommodated by the conveyor system but preferably having at least one relatively long straight side. Workpieces W may be closely spaced end-to-end in the direction of movement as shown in FIG. 1b. The conveyor means is an edge conveyor supporting either one or both of the opposite longitudinal sides of the workpiece.

The conveyor is driven by an adjustable speed motor 18 whose speed may be adjusted, for example, by a potentiometer 20 to obtain a Z-shaped pattern of an adjustable size, as will be more fully described. The speed of motor 18 may be controlled by either adjusting an input voltage or an input current. Any other adjustable speed motor may be used, if desired.

Two spray head assemblies, 22 and 22' are respectively provided to spray coat the upper and lower major surfaces of the workpiece in a sequential fashion. Only one of the spray coat assemblies will be described in detail for purposes of simplicity, it being understood that both assemblies 22, 22' are preferably the same in design and operation, the assemblies respectively spraying material downwardly and upwardly, although the order of spraying may be reversed if desired.

The spray head assembly 22 is positioned above upper run 12a and includes a spray head 24 coupled to a liquid source 26 pumped into spray head 24 by a pump 28 to provide a low pressure liquid spray. As an alternative, liquid source 26 may be a stationary source (not shown) positioned at a location adjacent to the conveyor and coupled through a flexible tube 30 to spray head 24 by pump 28, as shown in FIG. 1c. The tube is sufficiently flexible so as to provide a continuous flow of fluid to spray head 24 without kinking. For example, an intermediate portion 30a of tube 30 may be coiled and be free to respectively expand and contract as shown by arrow sets B and C to accommodate reciprocating movement of the spray assembly in the direction transverse to workpiece movement (see arrow A) to accommodate movement of the spray assembly between its opposite extremes. The pump 28 and/or a valve control 29 may be adjustable by an adjustable control 28a and valve control 29a (see FIG. 1c) to provide additional controls for obtaining a desired coating.

The spray assembly may be provided with a chassis 22a upon which members 24 and 26 and 28 are mounted. The chassis is provided with rollers R which extend into the grooves G of a pair of guide rails 32, 34 to guide assembly 22 and prevent lateral movement. The spray assembly is movable in a direction transverse to the direction of movement of conveyor belt upper run 12a as shown by arrows D in FIG. 1.

A closed loop drive belt 36 is entrained about a pair of drive belt rollers 38, 40 arranged at opposite ends of tracks 32 and 34 and extending between the tracks as shown in FIG. 1d. The rollers 38 and 40 are freewheelingly mounted.

A drive motor 42 mounted at one end of the tracks 32 and 34 which extend, for example, beyond the right-hand end of workpiece conveyor belt 12 drives roller 40 which in turn moves drive belt 36. The ends 36a and 36b of drive belt 36 are secured to opposite sides of spray assembly chassis 22a.

Motor 42 is provided with a speed adjustment means which may, for example, be an adjustable potentiometer 44 and further includes adjustable timing means 46 having an adjustment knob 46a and receiving a timer initiating signal from proximity sensor 48 which senses a probe or projection 22b extending downwardly from spray assembly 22 to pass in close proximity to sensor 48. Extremity sensors 50 and 52 are further provided at the extreme ends of the tracks for a purpose to be more fully described. The sensors may be proximity sensors, optical sensors or microswitches having switch arms which are closed when slidably engaged by probe 22b when it passes a switch arm.

Each spray coating assembly has an exhaust system 27, 27' respectively associated with each coating assembly. Only one exhaust system will be described in detail for purposes of brevity, it being understood that they are similar in design and function.

Exhaust systems 27 and 27' shown in dotted fashion in FIG. 1 control airflow and overspray and collect and dispose of any fumes noxious, toxic or otherwise. FIG. 1j shows an end view of the exhaust system 27 which has a U-shaped configuration and is positioned beneath upper run 12a. Exhaust system 27' is disposed above upper run 12a and is rotated 180° from the orientation of exhaust system 27. A vacuum is drawn through conduits 27a–27b, which are coupled to a vacuum (or blower source, not shown). Elongated openings along side surfaces 27c and 27d and top surface 27e draw air and overspray into the interior 27f of the exhaust system enclosure and out through conduits 27a, 27b. Filters 27g, 27h may be employed as shown. If desired, the sides 27c, 27d and 27e may be completely open.

The exhaust system is preferably used to support the guide tracks 32–34 of spray system 22.

The conveyor belt 12 may be any suitable conveyor material. For example, conveyor means 12, as shown in FIG. 1e, may be a pair of edge conveyors formed of open mesh wire to provide support for opposite parallel side edges of the workpiece. For example, each edge conveyor 12a, 12b may be comprised of longitudinal wires 13' and cross wires 12', wires 12' being arranged to pass about sprockets 14', 14' as shown in FIG. 1e.

Figure 1G:
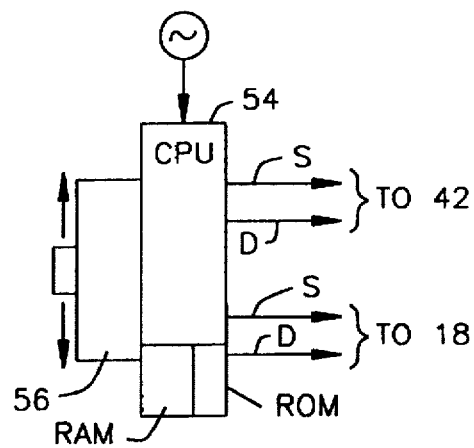
FIG. 1g shows one technique for controlling the operation of motor 42 of FIG. 1b.

The center section 12a" (FIG. 1e) is completely removed and the boards are supported along opposite parallel edges by "edge" conveyors $E_1$ and $E_2$ (FIG. 1g). By the use of clamping members 15" at spaced intervals along each of the edge conveyors, only one edge conveyor need be used. Note the clamps 15", 15" in FIG. 1e, which are movable to a displaced position 15'", 15'", to remove or insert a marginal side portion of a workpiece. The clamps 15", 15" may be pivotally mounted, spring-loaded clips normally biased to the closed position for urging the workpiece against the upper surface of the upper rune of conveyor 12. The workpieces are arranged so that the marginal side portions of the workpieces clamped or supported by the conveyor halves constitute portions which are not coated.

The use of only one set of clamps 15" on one of the edge conveyors can avoid the need for a set of clamps on both edge conveyors or can avoid the need for a pair of conveyors. Alternatively, two conveyor halves 12', 12" may be used without clamps. The conveyor halves are substantially free of coating material by virtue of the spray coater controls which limit the area spray coated to that area between the marginal side portions of the workpiece.

Figure 1H:
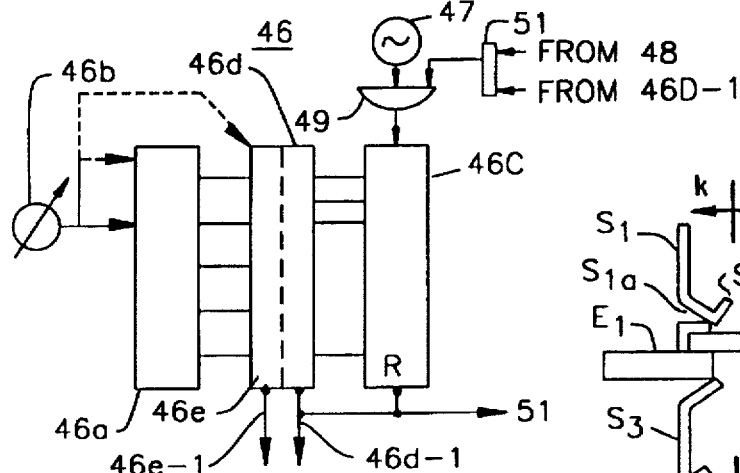
FIG. 1h shows a microprocessor-based control system for controlling the operation of the system of FIGS. 1 and 1b.
Figure 1J:
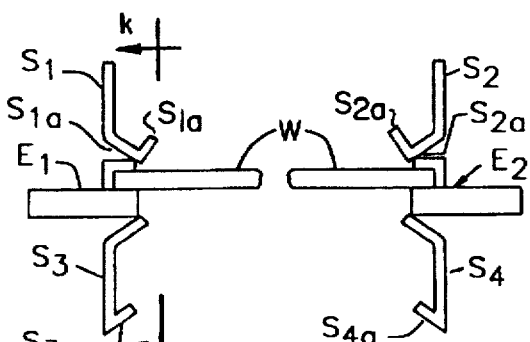
FIG. 1j is an elevational view of a portion of the spray apparatus showing the shielding apparatus.

The edge conveyors $E_1$ and $E_2$ grip a minimal marginal portion of the opposite parallel edges of a workpiece W, preferably of a width of 2–3 millimeters, as shown in FIG. 1j to maximize the coatable surface areas.

In addition shields $S_1$, $S_2$ shield the marginal edge portions of the workpieces as well as the edge conveyors $E_1$, $E_2$. The lower portions $S_{1a}$ and $S_{2a}$ of the shields form a trough to collect overspray. The troughs preferably slope slightly downwardly toward one end as shown in FIG. 1k to enable collected drops to be delivered to a drain tube $T_D$. The shields $S_1$, $S_2$ are preferably of a length L measured in the conveying direction which is slightly greater than the maximum spray pattern of the spray head a shown in FIG. 1a, also measured in the conveying direction. The shields $S_3$ and $S_4$ provided for shielding the underside of the workpieces and the edge conveyors likewise have slightly sloping troughs for collecting and delivering liquid overspray to drain tube $T_D$.

The operation of each of the spraying systems of the present invention is as follows:

Workpieces are arranged upon the upstream (left hand) end of conveyor upper run 12a (see FIG. 1) and are preferably positioned in close proximity so as to avoid wasteful use of spray.

Motor 18 is energized and motor speed of the motor is adjusted at potentiometer 20 to adjust the linear speed of conveyor upper run 12a.

Spray head 24 is arranged so that the longitudinal axis 24b of its oval-shaped spray pattern 24a (see FIG. 1a) is aligned substantially parallel to the direction of movement of workpieces represented by arrow A and so that the width dimension of the spray pattern represented by transverse axis 24c is substantially perpendicular to the direction A. A ratio of 5:1 of length to width of the spray pattern is preferred. The ratio may be modified, so long as the length dimension is greater than the width dimension.

The timer 46 of motor 44 is adjusted to a predetermined time interval and the operating speed of drive motor 42 is adjusted by potentiometer 44.

Assuming that the spray assembly 22 moves toward the right relative to FIG. 1b, the probe 22b on passing proximity sensor 48 causes a pulse to be applied to timer unit 46. This pulse initiates the timer which times out according to the interval selected by adjustment knob or control 46a. Upon reaching the end of the selected time interval, the timer times out, automatically reversing the rotational direction of drive motor 42 thereby reversing the direction of movement of the spray assembly 22.

In moving toward the left, the probe 22b again passes proximity sensor 48 causing initiation of the operation of timer 46. When the time period times out, the timing unit reverses direction of motor 42 causing the spray assembly to move from left to right.

Additional extremity sensors 50 and 52 may be provided, if desired. The extremity sensors can be utilized either to automatically stop motor 42 or alternatively to stop and reverse motor 42. Sensors 50 and 52 may be located at the extremities of the range of permissible movement thereby, for example, protecting against continuous movement of the spray assembly due to the failure of the proximity sensor 48 to detect the passage of probe 22b.

As another alternative, the extremity sensors 50 and 52 may be slidably mounted along the support and track assembly and moved and manually moved to a desired position.

As another alternative, shown in FIG. 1f, each of the extremity sensors 50 and 52 may alternatively comprise a pair of sensors, for example, sensor assembly 50' may be comprised of a pair of sensors 50a' and 50b' spaced a predetermined distance apart by a spacing member 50c'. Similarly sensor assembly 52' may comprise a pair of sensors 52a', 52b' spaced apart by a spacer 52c'. Sensor assemblies 50' and 52' are movable along the track supporting assembly and, as spray assembly 22 moves toward the right in FIG. 1f, probe 22b passes sensor 52a' which causes the motor to decelerate. As the motor is decelerating, it comes in the vicinity of proximity sensor 52b' which causes the motor to stop and reverse direction. In moving from the right to the left, as probe 22b passes sensor 52a' the motor is accelerated to the maximum selected speed. The arrangement of FIG. 1f may be used either with or without a centrally located sensor 48. Alternatively, sensor assemblies 50' and 52' may consist of only one sensor, eliminating the decelerating sensor.

FIG. 1h shows one embodiment of a timer arrangement for each spray coater. Timer 46 is comprised of a register 46a for inputting a digital representation of a numeric analog input through adjustable means 46b.

Oscillator 47 applies incrementing pulses to counter 46c through gate 49 responsive to an output from a bistable flip-flop circuit 51 which opens gate 49 to provide accumulating pulses to counter 46c. When the count in counter 46c is the same as the count in register 46a, comparator 46d develops an output at 46d-1 which is simultaneously applied to a reset input of counter 46c to reset the counter and is applied to a reset input for bistable flip-flop 51.

The comparator may comprise, in addition to comparator 46d, a second comparator 46e which compares the count in counter 46c against a value which is a predetermined numeric quantity less than the value set into a register portion 46a-1 by input 46b whereupon a signal is developed when the count in counter 46c reaches its lower count which signal appears at output 46e-1 to cause the motor to slow down a predetermined time before reaching the count value set in to register 46a representing the extreme end of the range of movement selected according to the workpieces being treated.

Figure 1I:
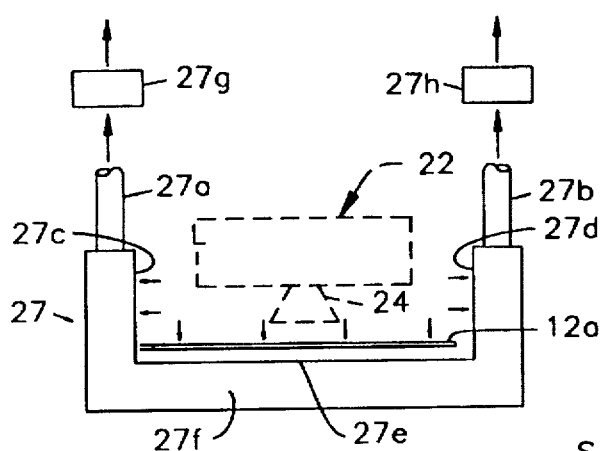
FIG. 1i is an end view showing the exhaust system employed in the system of FIG. 1 in greater detail.
Figure 1K:
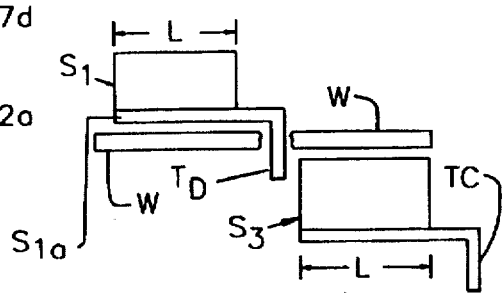
FIG. 1k is a view of the shields looking in the direction of arrows 1k—1k in FIG. 1j.

As shown in FIG. 1i, the system control may comprise a CPU 54 receiving variable input information from input means 56 and containing a stored program in a ROM and having a RAM memory. Suitable algorithms are provided in the CPU for automatically selecting the drive speed of motors 18 and 42 by inputting information including the thickness of the desired coating, the nature of the coating material and the width of workpieces arranged in the direction transverse to the direction of movement of conveyor 12. This information is utilized to compute control signals provided to motors 18 and 42. For example, motor speed S and motor direction D may be provided as outputs to motors 18 and 42 as shown in FIG. 1i.

The spray liquid may be a photoresist, a conformal protective coating or any other liquid coating typically applied to printed circuit boards. The boards may be coated before or after having components assembled thereon.

The workpieces, once mounted upon the conveyor are sequentially spray coated on the upper and lower major surfaces without the need for removing workpieces, drying the coated surface and replacing the workpieces upon the conveyor (after they are turned over, for example) thereby significantly reducing the amount of manual handling and the drying time required using conventional techniques. Drying of both sides takes place substantially simultaneously.

The shields keep the opposite parallel marginal edges and the edge conveyors free of overspray and simplify cleaning and minimize the frequency of cleaning operations.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described. For example, the lower surface of the workpiece may be spray-coated first, followed by the upper surface.

What is claimed is:

1. Apparatus for coating opposing surfaces of workpieces comprising:

conveyor means including motor means for conveying workpieces in a given direction;

first and second spray assemblies each including a spray head for producing a liquid spray in a given pattern;

first and second means for respectively delivering a spray liquid to said first and second spray assemblies;

first means for reciprocally mounting said first spray assembly above said conveyor means to deliver a liquid spray from said spray head downwardly toward an upper surface of a workpiece arranged on the conveyor means, first means for moving said first spray assembly in a reciprocating fashion along a path transverse to said given direction as spray liquid is being sprayed on moving workpieces by said first spray assembly; and second means for reciprocally mounting said second spray assembly a spaced distance below said conveyor means to deliver a liquid spray from said spray head upwardly toward a lower surface of a workpiece arranged on the conveyor means, second means for moving said second spray assembly in a reciprocating fashion along a path transverse to said given direction as spray liquid is being sprayed on moving workpieces by said second spray assembly.

2. The apparatus of claim 1 further comprising means for adjusting the moving speed of said motor means.

3. The apparatus of claim 2 wherein said first and second means for adjusting the moving speed of said conveyor means comprises means for adjusting an output speed of said motor means.

4. The apparatus of claim 3 wherein said adjusting means comprises means for adjusting an voltage and/or current applied to said motor means.

5. The apparatus of claim 1 further comprising first and second means for respectively adjusting the moving speed of said first and second means for moving said first and second spray assemblies.

6. The apparatus of claim 1 further comprising means for adjusting outer limits of reciprocating movement of the first and second spray assemblies along said path according to size and/or arrangement of workpieces on the conveyor means to maximize efficient use of spray liquid and reduce waste thereof as well as facilitating setup changes of said apparatus to accommodate different coating thicknesses and workpieces of differing sizes.

7. The apparatus of claim 1 wherein each of said means for reciprocally mounting comprises a track assembly extending in said transverse direction;

each of said spray assemblies having means guided by its associated track assembly to constrain linear movement of said spray assembly along said path and prevent movement lateral to said path.

8. The apparatus of claim 1 wherein each spray head includes means for providing a substantially oval-shaped spray pattern.

9. The apparatus of claim 8 wherein each oval-shaped spray pattern has a longitudinal dimension extending along a longitudinal axis which is substantially parallel to said given direction and a latitudinal width dimension measured along a latitudinal axis perpendicular to said given direction;

said longitudinal dimension being greater than said latitudinal dimension.

10. The apparatus of claim 9 wherein the longitudinal dimension is five times greater than the latitudinal dimension.

11. The apparatus of claim 1 wherein said conveying means further comprises a pair of spaced, edge conveyors for supporting workpieces;

said edge conveyors being entrained about at least a pair of rollers;

said motor means being coupled to drive at least one of said rollers and said means for adjusting the speed of the conveyor means including means for controlling an output speed of said motor means.

12. The apparatus of claim 1 wherein each of said first and second means for delivering a spray liquid comprises:

flexible conduit means for conveying a spray liquid to an associated spray head from a liquid source remote from said reciprocating spray assembly, said conduit means being yieldable to permit movement of an outlet end of said conduit means relative to an inlet end so that reciprocating movement of the spray assembly does not affect continuous low pressure flow of liquid.

13. The apparatus of claim 12 wherein each of said flexible conduit means is of a length sufficient to accommodate reciprocating movement of said spray assembly without affecting delivery of fluid to its associated spray head.

14. The apparatus of claim 13 wherein said predetermined time interval is determined by adjustable timing means which initiates a timed period responsive to said control pulse.

15. The apparatus of claim 1 wherein each of said first and second means for delivering a spray liquid further comprises a source of spray liquid and means for delivering spray liquid to an associated spray head at a low pressure.

16. The apparatus of claim 15 wherein each of said means for delivering a spray liquid includes adjustable means for controlling a flow of liquid from its associated spray head.

17. The apparatus of claim 1 wherein each of said first and second means for reciprocally mounting a spray assembly further comprises:

a drive conveyor entrained about a pair of rollers supported by said track assembly, each spray assembly including a chassis coupled to said drive belt;

each of said first and second means for moving a spray assembly including means for adjusting a reciprocating speed of an associated spray assembly comprising drive motor means coupled to at least one of said rollers supporting said drive belt; and means for adjusting an output speed of said drive motor.

18. The apparatus of claim 17 further comprising first and second sensor means each positioned along said path of an associated one of said first and second spray assemblies for sensing passage of its associated spray assembly to generate a control pulse; and means for adjusting a range of reciprocating movement of an associated spray assembly comprising means responsive to a control pulse for controlling a drive motor to drive the associated spray assembly in a given direction and to reverse direction of movement of the associated spray assembly after a predetermined time interval responsive to said control pulse.

19. The apparatus of claim 18 wherein each spray assembly is provided with a projecting probe which is positioned in close proximity to said proximity sensors when the associated spray assembly is passing a sensor for actuating a proximity sensor.

20. The apparatus of claim 1 further comprising means for adjusting outer limits of a range of reciprocating movement of each spray assembly along its associated path comprises slidably mounted sensors for detecting a presence of an associated spray assembly to reverse direction of an output of said drive means; and said sensors being slidably positionable along said path.

21. The apparatus of claim 20 wherein said sensors are proximity sensors.

22. The apparatus of claim 20 wherein said sensors are switch means closed by sliding engagement with a probe of an associated spray assembly as it passes said switch means.

23. The apparatus of claim 20 wherein said sensors are microswitches and each spray assembly is provided with projecting means for activating an associated microswitch as an associated spray assembly is passing its associated microswitch.

24. The apparatus of claim 1 further comprising exhaust means for regulating airflow and overspray in a spray region of at least one of said spray assemblies.

25. The apparatus of claim 24 wherein said exhaust means is arranged adjacent to said conveyor means for drawing air and/or spray directed toward both longitudinal sides of said conveyor means and directed downwardly and through said conveyor means and delivering withdrawn air and/or spray to an outlet.

26. The apparatus of claim 1 further comprising first and second exhaust means for respectively regulating airflow and overspray in a spray region of said first and second spray assemblies.

27. The apparatus of claim 26 wherein each of said exhaust means is arranged adjacent to said conveyor means for drawing air and/or spray directed toward both longitudinal sides of said conveyor means and directed respectively upwardly and downwardly and through a plane of said conveyor means to deliver withdrawn air and/or spray to an outlet.

28. The apparatus of claim 1 wherein said conveyor means comprises clamping means for clamping a marginal portion of opposite parallel sides of workpieces.

29. The apparatus of claim 1 wherein said conveyor means comprises clamping means for clamping a marginal portion of at least one side of workpieces.

30. The apparatus of claim 1 further comprising means for shielding the conveyor means and marginal edge of workpieces from overspray.

31. The apparatus of claim 30 wherein said means for shielding includes means for collecting and directing overspray to a collector means.

32. The apparatus of claim 30 further comprising means for removably mounting said shielding means to facilitate cleaning thereof.

33. The apparatus of claim 1 wherein said first and second means for reciprocally mounting each includes means to maintain its associated spray assembly a given distance away from said conveyor means as said spray assembly is reciprocated.

34. The apparatus of claim 1 wherein said conveyor means moves workpieces along a path lying in a given plane and said first and second means for reciprocally mounting each include means for limiting movement of its associated spray assembly along a path substantially parallel to said given plane as said spray assembly is being reciprocated.

35. The apparatus of claim 34 wherein said given plane is a substantially horizontal plane.

36. The apparatus of claim 1 wherein said first and second means for delivering a spray liquid to each spray assembly provides a substantially continuous fluid flow to the spray heads during reciprocating movement of the spray heads.

37. The apparatus of claim 1 wherein said first and second means for delivering a spray liquid comprise low pressure air spray means.

38. The apparatus of claim 1 wherein said conveyor means moves said workpieces along a substantially horizontal path and said path of movement of said first and second spray assemblies are substantially horizontal and transverse to the path of movement of workpieces along said conveyor means.

39. Apparatus for coating opposing surfaces of workpieces comprising:

conveyor means including motor means for conveying workpieces in a given direction;

first and second spray assemblies each including a spray head for producing a liquid spray in a given pattern;

first and second means for respectively delivering a spray liquid to said first and second spray assemblies;

first means for reciprocally mounting said first spray assembly above said conveyor means to deliver a liquid spray from said spray head downwardly toward an upper surface of a workpiece arranged on the conveyor means, first means for moving said first spray assembly in a reciprocating fashion along a path transverse to said given direction as spray liquid is being sprayed on moving workpieces by said first spray assembly; and second means for reciprocally mounting said second spray assembly a spaced distance below said conveyor means to deliver a liquid spray from said spray head upwardly toward a lower surface of a workpiece arranged on the conveyor means, second means for moving said second spray assembly in a reciprocating fashion along a path transverse to said given direction as spray liquid is being sprayed on moving workpieces by said second spray assembly;

microprocessor-based controller means including means for adjusting a moving speed of said conveyor means, means for adjusting a moving speed of said first and second spray assemblies, and means for adjusting outer limits of reciprocating movement of the first and second spray assemblies along said path according to size and/or arrangement of workpieces on the conveyor means to maximize efficient use of spray liquid and reduce waste thereof as well as facilitating setup changes of said apparatus to accommodate different coating thicknesses and workpieces of differing sizes.

40. The apparatus of claim 39 wherein said conveyor means comprises edge conveyor means for supporting at least one edge of a workpiece beneath the spray assembly.

41. The apparatus of claim 39 wherein said controller means further includes means for operating said conveyor means drive means, said means for delivering a spray liquid and said means for reciprocating so as to move workpieces past said first and second spray assemblies when said spray assemblies are being reciprocated and are emitting a spray liquid.

42. The apparatus of claim 39 wherein said controller means further includes means for operating said conveyor means drive means, said first and second means for delivering a spray liquid and said first and second means for reciprocating so as to form a substantially Z-shaped spray pattern of liquid spray on opposite surfaces of a workpiece.

43. The apparatus of claim 39 wherein said controller means further includes means for operating said conveyor means drive means, said first and second means for delivering a spray liquid and said first and second means for reciprocating so as to spray given areas on opposite surfaces of a workpiece, a width of said given areas being controlled by controlling end limits of a reciprocating range of the associated spray head.

44. Apparatus for coating opposing surfaces of workpieces comprising:

conveyor means including motor means for conveying workpieces in a given direction;

first and second spray assemblies each including a spray head for emitting a spray in a given pattern;

first and second means for respectively delivering a spray material to said first and second spray assemblies;

means for guiding each of said first and second spray assemblies so that said first and second assemblies are each movable along an associated path, each path being transverse to said given direction whereby, said first and second spray assemblies emit a spray material from said spray heads toward opposing surfaces of a workpiece moved by the conveyor means; and means for moving said first and second spray assemblies in a reciprocating fashion along their respective paths as spray material is sprayed on opposing surfaces of moving workpieces by said first and second spray assemblies in a direction transverse to said given direction.

45. The apparatus of claim 44 wherein said means for moving includes means for adjustably limiting end points of reciprocating movement of each spray assembly to maintain marginal portions of a workpiece on opposite sides thereof free of spray material.

46. The apparatus of claim 44 wherein said means for moving and said conveyor means cooperate to cause each of the spray heads to cause spray material to be applied to associated surfaces of a workpiece in a substantially Z-shaped pattern.

* * * * *